United States Patent
Kurioka

(10) Patent No.: US 12,191,359 B2
(45) Date of Patent: Jan. 7, 2025

(54) METHOD OF MANUFACTURING SILICON CARBIDE SEMICONDUCTOR DEVICE AND SILICON CARBIDE SEMICONDUCTOR DEVICE

(71) Applicant: FUJI ELECTRIC CO., LTD., Kawasaki (JP)

(72) Inventor: Yu Kurioka, Matsumoto (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 408 days.

(21) Appl. No.: 17/829,065

(22) Filed: May 31, 2022

(65) Prior Publication Data
US 2023/0018824 A1 Jan. 19, 2023

(30) Foreign Application Priority Data

Jul. 15, 2021 (JP) .................. 2021-117038

(51) Int. Cl.
| | |
|---|---|
| H01L 29/78 | (2006.01) |
| H01L 21/336 | (2006.01) |
| H01L 29/16 | (2006.01) |
| H01L 29/36 | (2006.01) |
| H01L 29/66 | (2006.01) |

(52) U.S. Cl.
CPC .......... *H01L 29/36* (2013.01); *H01L 29/1608* (2013.01); *H01L 29/66068* (2013.01); *H01L 29/7813* (2013.01)

(58) Field of Classification Search
CPC ................. H01L 29/36; H01L 29/1608; H01L 29/66068; H01L 29/7813; H01L 21/049; H01L 29/0623; H01L 29/0878; H01L 29/1095; H01L 29/518
See application file for complete search history.

(56) References Cited

U.S. PATENT DOCUMENTS

| | | | |
|---|---|---|---|
| 2008/0085591 A1* | 4/2008 | Gomez | H01L 29/8083 257/E29.313 |
| 2014/0015045 A1* | 1/2014 | Su | H01L 29/0886 257/334 |
| 2014/0367771 A1* | 12/2014 | Chatty | H01L 29/66719 257/329 |

(Continued)

FOREIGN PATENT DOCUMENTS

| | | |
|---|---|---|
| JP | 4549167 B2 | 9/2010 |
| JP | 2019145570 A | 8/2019 |
| JP | 6773198 B1 | 10/2020 |

*Primary Examiner* — Samuel Park
(74) *Attorney, Agent, or Firm* — Rabin & Berdo, P.C.

(57) ABSTRACT

A process of forming a gate insulating film in a silicon carbide semiconductor device. The process includes performing a first stage of a nitriding heat treatment by a gas containing oxygen and nitrogen, followed by depositing an oxide film, and then performing a second stage of the nitriding heat treatment by a gas containing nitric oxide and nitrogen. The amount of nitrogen at the treatment starting point of the first stage of the nitriding heat treatment is greater than the amount of nitrogen at the treatment starting point of the second stage of the nitriding heat treatment. The amount of nitrogen at the treatment ending point of the second stage of the nitriding heat treatment is greater than the amount of nitrogen at the treatment ending point of the first stage of the nitriding heat treatment.

5 Claims, 5 Drawing Sheets

(56) References Cited

U.S. PATENT DOCUMENTS

| | | | |
|---|---|---|---|
| 2016/0247910 A1* | 8/2016 | Suzuki | H01L 29/66068 |
| 2017/0141186 A1* | 5/2017 | Shiomi | H01L 29/1608 |
| 2018/0033876 A1* | 2/2018 | Sugahara | H01L 29/45 |
| 2018/0040687 A1* | 2/2018 | Araoka | H01L 29/0878 |
| 2019/0051739 A1* | 2/2019 | Naito | H01L 29/36 |
| 2021/0013039 A1 | 1/2021 | Onishi et al. | |
| 2021/0134961 A1 | 5/2021 | Utsumi et al. | |
| 2022/0157959 A1* | 5/2022 | Kim | H01L 29/7813 |

\* cited by examiner

FIG.4

| | MOBILITY [cm²/V·s] | THRESHOLD VOLTAGE [V] |
|---|---|---|
| CONVENTIONAL | 52 | 3.6 |
| EMBODIMENT | 65 | 5.2 |

METHOD OF MANUFACTURING SILICON CARBIDE SEMICONDUCTOR DEVICE AND SILICON CARBIDE SEMICONDUCTOR DEVICE

CROSS REFERENCE TO RELATED APPLICATIONS

This application is based upon and claims the benefit of priority of the prior Japanese Patent Application No. 2021-117038, filed on Jul. 15, 2021, the entire contents of which are incorporated herein by reference.

BACKGROUND OF THE INVENTION

1. Field of the Invention

Embodiments of the invention relate to a method of manufacturing a silicon carbide semiconductor device and a silicon carbide semiconductor device.

2. Description of the Related Art

Silicon carbide (SiC) is expected as a next generation semiconductor material to replace silicon (Si). Compared to a conventional semiconductor device element using silicon as a semiconductor material, a semiconductor device element using silicon carbide as a semiconductor material (hereinafter, silicon carbide semiconductor device) has various advantages such as enabling resistance of a device element in an ON state to be reduced to a few hundredths and application under higher temperature (at least 200 degrees C.) environments. These advantages are due to characteristics of the material itself in that a band gap of silicon carbide is about 3 times larger than that of silicon and dielectric breakdown field strength thereof is nearly an order of magnitude greater than that of silicon.

Up to now, Schottky barrier diodes (SBDs) and vertical metal oxide semiconductor field effect transistors (MOSFETs) having a trench gate structure or planar gate structure have become commercialized as silicon carbide semiconductor devices.

A planar gate structure is an oxide semiconductor field (MOS) gate structure in which a MOS gate is provided in a flat plate-like shape on a front surface of a semiconductor substrate. A trench gate structure is a MOS gate structure in which a MOS gate is embedded in a trench formed in a semiconductor substrate (semiconductor chip), at a front surface thereof and a channel (inversion layer) is formed along a sidewall of the trench in a direction orthogonal to the front surface of the semiconductor substrate. Therefore, compared to the planar gate structure in which a channel is formed along the front surface of the semiconductor substrate, unit cell (constituent unit of device element) density per unit area may be increased and current density per unit area may be increased, which are advantageous in terms of cost.

A structure of a conventional silicon carbide semiconductor device is described taking a trench-type SiC-MOSFET as an example. In a trench gate structure, on a front surface of an $n^+$-type silicon carbide substrate, an $n^-$-type silicon carbide epitaxial layer is deposited. The $n^-$-type silicon carbide epitaxial layer has a first surface and a second surface that are opposite to each other, the second surface facing the $n^+$-type silicon carbide substrate, and at the first surface, n-type high-concentration regions are provided. In the n-type high-concentration regions, second $p^+$-type base regions are selectively provided so as to underlie bottoms of trenches.

MOS gates of the trench gate structure are configured by a p-type base layer, $n^+$-type source regions, $p^+$-type contact regions, the trenches, a gate insulating film, and gate electrodes. The $p^+$-type contact regions may be omitted.

In a method of manufacturing the gate insulating film of the MOS gates of the trench gate structure, first, under an oxygen atmosphere, an oxide film is deposited by a chemical reaction (chemical vapor deposition method) such as high-temperature oxidation for a high temperature oxide (HTO) or thermal oxidation at a temperature of about 1000 degrees C.

In the trench-type SiC-MOSFET, the state of an interface between the oxide film ($SiO_2$) and silicon carbide (SiC) affects device characteristics. While a thermal oxide film is superior to a $SiO_2$ film, in an instance in which SiC is oxidized, excess carbon (C) occurs and thus, the $SiO_2$/SiC interface is adversely affected, causing degradation of the device characteristics. Therefore, a deposited $SiO_2$ film may be used. Nonetheless, for example, film density and insulation performance of a deposited $SiO_2$ film formed by plasma CVD (chemical vapor deposition), sputtering, or the like are insufficient and undesirable from a practical standpoint.

Further, while it is desirable for the film thickness of the gate insulating film to be uniform at all portions in the trenches, a deposited $SiO_2$ film formed by plasma CVD, sputtering, or the like is problematic in that the film thickness thereof differs at the bottoms and sidewalls of the trenches, and even within the portions of the $SiO_2$ film deposited at the sidewalls, the film thickness tends to increase with increasing proximity to the openings of the trenches. A $SiO_2$ film deposited by high-temperature oxidation has a uniform thickness and a relatively favorable film quality and therefore, is generally used for the gate insulating film of a trench-type SiC-MOSFET.

Next, an annealing treatment is performed on the oxide film. In an instance of formation by thermal oxidation, an interface level density of the interface between the oxide film and semiconductor portions may be reduced by a heat treatment (post oxidation annealing (POA) treatment). In an instance in which the oxide film is formed by a deposition method such as that for a HTO, to improve electrical characteristics (mobility, etc.), in general, post-annealing by a gas containing nitrogen ($N_2$), etc. is performed after the HTO deposition. For example, NO annealing at a temperature of about 1300 degrees C. by a NO10%/$N_2$ gas is performed for about 30 minutes. Thus, the gate insulating film is formed.

Nonetheless, when a silicon carbide substrate is thermally oxidized and an oxide film is formed, a portion of the carbon in the silicon carbide substrate cannot be sublimated and remains in the oxide film. In particular, in the oxide film, the carbon that remains within a range of a few nm from an interface between the silicon carbide substrate and the oxide film is thought to contribute to the generation of charge traps. Such charge traps are thought to cause variation of the threshold voltage when positive bias is applied to the gate electrodes.

Therefore, according to a known method, thermal oxidation is performed under a nitrogen atmosphere containing a nitric oxide (NO) gas, before the oxide film is deposited (for example, refer to Japanese Laid-Open Patent Publication No. 2019-145570). In this method of manufacturing, first, NO annealing at a temperature of 1300 by a NO10%/$N_2$ gas is performed for about 30 minutes. Next, a CVD method is used to form a deposited film on the surface of the oxide film. In the gate insulating film formed in this manner, residual carbon is favorably suppressed and charge traps in the oxide film are favorably reduced.

Further, according to another known method, before and after gate insulating film formation, a nitriding treatment is performed that includes a nitriding treatment step that pacifies a surface of a silicon carbide base by nitrogen and is performed under a nitric oxide or nitrous oxide gas atmosphere, a treatment temperature from 900 degrees C. to 1450 degrees C., and a treatment time of 30 minutes to 6 hours; a step that forms, by a vapor deposition method, an insulating film on the surface of the silicon carbide base subjected to the nitriding treatment step; and heat treating the insulating film under a nitric oxide or nitrous oxide gas atmosphere (for example, refer to Japanese Patent No. 4549167).

Further, according to another known method, a post-deposition heat treatment (post-deposition annealing (PDA)) is performed under a nitrogen atmosphere containing about 10% nitric oxide (90% $N_2$+10% NO) (for example, refer to Japanese Patent No. 6773198).

SUMMARY OF THE INVENTION

According to an embodiment of the invention, a method of manufacturing a silicon carbide semiconductor device includes: preparing a silicon carbide semiconductor substrate of a first conductivity type, the silicon carbide semiconductor substrate having a first surface and a second surface that are opposite to each other; forming a first semiconductor layer of the first conductivity type on the first surface of the silicon carbide semiconductor substrate, the first semiconductor layer having an impurity concentration that is lower than an impurity concentration of the silicon carbide semiconductor substrate, the first semiconductor layer having a first surface and a second surface that are opposite to each other, the second surface of the first semiconductor layer facing the silicon carbide semiconductor substrate; forming a second semiconductor layer of a second conductivity type on the first surface of the first semiconductor layer, the second semiconductor layer having a first surface and a second surface that are opposite to each other, the second surface of the second semiconductor layer facing the silicon carbide semiconductor substrate; selectively forming a plurality of first semiconductor regions of the first conductivity type in the second semiconductor layer, at the first surface of the second semiconductor layer; forming a plurality of trenches that penetrate through the first semiconductor regions and the second semiconductor layer, and reach the first semiconductor layer; forming a gate insulating film in the trenches, along sidewalls and bottoms of the trenches; forming a plurality of gate electrodes on the gate insulating film in the trenches; forming a first electrode on surfaces of the first semiconductor regions and the first surface of the second semiconductor layer; and forming a second electrode on the second surface of the silicon carbide semiconductor substrate. Forming the gate insulating film includes forming the gate insulating film using a nitriding heat treatment that has a first stage and a second stage, by performing the first stage of the nitriding heat treatment by a first gas containing oxygen and nitrogen, depositing an oxide film after performing the first stage of the nitriding heat treatment, and performing the second stage of the nitriding heat treatment by a second gas containing nitric oxide and nitrogen, after depositing the oxide film. An amount of the nitrogen at a treatment starting point of the first stage of the nitriding heat treatment is greater than an amount of the nitrogen at a treatment starting point of the second stage of the nitriding heat treatment. An amount of the nitrogen at a treatment ending point of the second stage of the nitriding heat treatment is greater than an amount of the nitrogen at a treatment ending point of the first stage of the nitriding heat treatment.

Objects, features, and advantages of the present invention are specifically set forth in or will become apparent from the following detailed description of the invention when read in conjunction with the accompanying drawings.

BRIEF DESCRIPTION OF THE DRAWINGS

FIG. 4 is a table showing mobility and threshold voltage of silicon carbide semiconductor devices manufactured by a conventional method and the method of the embodiment.

DETAILED DESCRIPTION OF THE INVENTION

Figure 1:
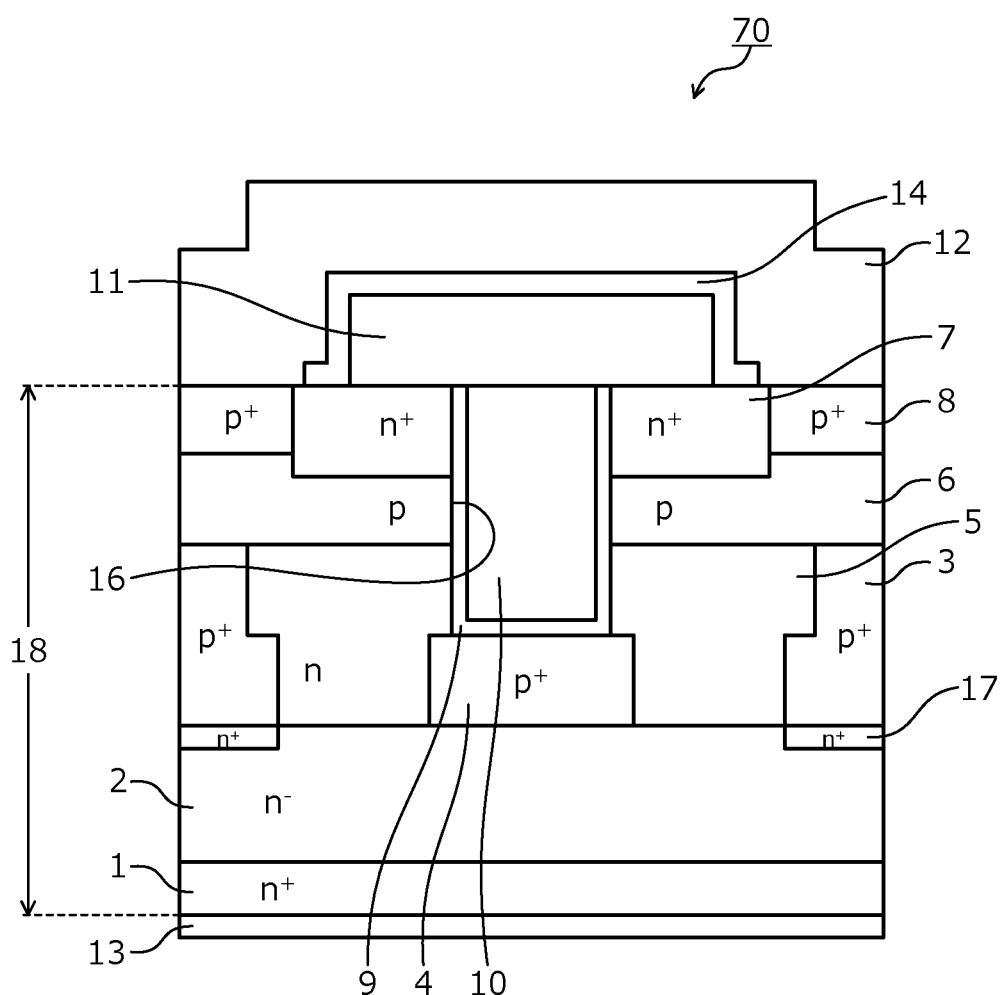
FIG. 1 is a cross-sectional view depicting a structure of a silicon carbide semiconductor device according to an embodiment.

First, problems associated with the conventional techniques are discussed. While high-temperature oxidation may form a deposited $SiO_2$ film, a gas (NO) containing oxygen is introduced in the source gas and thus, at the initial moment of deposition, the SiC is oxidized, which causes excess C (carbon clusters) to precipitate in small amounts. In an instance in which the gate insulating film is formed by high-temperature oxidation, SiC is oxidized very thinly at the interface region, whereby excess C occurs at the $SiO_2$/SiC interface. Further regarding this portion, the oxidation disturbs the crystal at the $SiO_2$/SiC interface.

Further, while oxidation slightly varies depending on the HTO equipment and film formation conditions, the occurrence of oxidation at the initial stage of film formation generally cannot be completely suppressed. In the conventional method in which processes are performed in the sequence of HTO/NO, the SiC surface is oxidized about 2 nm during HTO film formation. Furthermore, by the subsequent NO annealing, O reaches the interface and is subjected to post-oxidation, whereby the amount of oxidation increases. Further, in the case of the process in Japanese Laid-Open Patent Publication No. 2019-145570 in which the processes are performed in the sequence of NO/HTO with the NO annealing being performed first, it was found by analysis that the surface is oxidized about 5 nm by the initial NO annealing. In a trench-type MOSFET, current is thought to pass through a channel about 2 nm to 5 nm from the surface of the trench sidewall. The initial oxidation in HTO film formation is about 2 nm and when the NO annealing treatment is performed first, the oxidation is about 5 nm and thus, the current passes through portions where the crystal is damaged, thereby adversely affecting characteristics. Therefore, to improve device element characteristics, it is important to suppress the oxidation of SiC at the trench sidewalls where the channels are formed. This oxidation cannot be completely suppressed and therefore, one challenge in improving electrical characteristics is to not allow excess C to remain at the $SiO_2$/SiC interface or in the HTO film as far as possible.

Further, nitriding the interface a suitable amount is effective in improving characteristics and therefore, a manufacturing process for reducing the escape of nitrogen from the interface is important. In an instance in which the NO annealing is performed after the HTO formation, from results shown in later-described FIG. 3, it is found that N is lost in the HTO film, near the oxide film surface of the HTO film, opposite to the surface of the HTO film facing the SiC. Thus, achieving uniform distribution of N in the oxide film is difficult. In addition, in the HTO/NO described above, a phenomenon occurs in which leak current in a low electric field region increases when time zero dielectric breakdown (TZDB) capability is measured and thus, reliability is problematic.

Further, in the conventional method of performing the processes in the sequence of 10% NO/HTO/10% NO, while nitrogen is uniformly distributed in the HTO film, the SiC interface is oxidized in the initial NO annealing, whereby the interface level at the $SiO_2$/SiC interface may increase.

Embodiments of a method of manufacturing a silicon carbide semiconductor device and a silicon carbide semiconductor device according to the present invention are described in detail with reference to the accompanying drawings. In the present description and accompanying drawings, layers and regions prefixed with n or p mean that majority carriers are electrons or holes. Additionally, + or − appended to n or p means that the impurity concentration is higher or lower, respectively, than layers and regions without + or −. In the description of the embodiments below and the accompanying drawings, main portions that are identical will be given the same reference numerals and will not be repeatedly described. Further, in the present description, when Miller indices are described, "−" means a bar added to an index immediately after the "−", and a negative index is expressed by prefixing "−" to the index. Further, with consideration of variation in manufacturing, description indicating the same or equal may be within 5%.

A semiconductor device according to the present invention contains a wide band gap semiconductor. In an embodiment, a silicon carbide semiconductor device fabricated (manufactured) using, for example, silicon carbide (SiC) as a wide band gap semiconductor is described taking a trench-type MOSFET 70 as an example. FIG. 1 is a cross-sectional view depicting a structure of the silicon carbide semiconductor device according to the embodiment. In FIG. 1, only an active region through which a main current flows in the trench-type MOSFET 70 is depicted.

As depicted in FIG. 1, in the silicon carbide semiconductor device according to the embodiment, an n⁻-type silicon carbide epitaxial layer (first semiconductor layer of a first conductivity type) 2 is deposited on a first main surface (front surface), for example, a (0001) plane, (Si plane), of an n⁺-type silicon carbide substrate (silicon carbide semiconductor substrate of the first conductivity type) 1.

The n⁺-type silicon carbide substrate 1 is a silicon carbide single crystal substrate. The n⁻-type silicon carbide epitaxial layer 2 has an impurity concentration that is lower than an impurity concentration of the n⁺-type silicon carbide substrate 1 and, for example, constitutes a low-concentration n-type drift layer. N-type high-concentration regions 5 may be provided at a first surface of the n⁻-type silicon carbide epitaxial layer 2, opposite to a second surface thereof facing the n⁺-type silicon carbide substrate 1. The n-type high-concentration regions 5 constitute a high-concentration n-type drift layer and have an impurity concentration that is lower than the impurity concentration of the n⁺-type silicon carbide substrate 1 and higher than the impurity concentration of the n⁻-type silicon carbide epitaxial layer 2.

A p-type base layer (second semiconductor layer of a second conductivity type) 6 is provided at the first surface of the n⁻-type silicon carbide epitaxial layer 2, opposite to the second surface thereof facing the n⁺-type silicon carbide substrate 1. Hereinafter, the n⁺-type silicon carbide substrate 1, the n⁻-type silicon carbide epitaxial layer 2, the n-type high-concentration regions 5, and the p-type base layer 6 combined are assumed as a silicon carbide semiconductor base (semiconductor substrate containing silicon carbide) 18.

A drain electrode constituting a back electrode (second electrode) 13 is provided on a second main surface (back surface, i.e., back surface of the silicon carbide semiconductor base 18) of the n⁺-type silicon carbide substrate 1. A drain electrode pad (not depicted) is provided on the surface of the back electrode 13.

A trench structure is provided in the silicon carbide semiconductor base, at a first main side thereof (side having the p-type base layer 6). In particular, the p-type base layer 6 has a first surface (the first main side of the silicon carbide semiconductor base) and a second surface that are opposite to each other, the second surface facing the n⁺-type silicon carbide substrate 1, and from the first surface of the p-type base layer 6, trenches 16 penetrate through the p-type base layer 6 and reach the n-type high-concentration regions 5 (in an instance in which the n-type high-concentration regions 5 are omitted, the n⁻-type silicon carbide epitaxial layer 2, hereinafter, simply "(2)"). Along inner walls of the trenches 16, a gate insulating film 9 is provided on bottoms and sidewalls of the trenches 16; and gate electrodes 10 are formed on the gate insulating film 9 in the trenches 1. The gate electrodes 10 are insulated from the n-type high-concentration regions 5 (2) and the p-type base layer 6 by the gate insulating film 9. A portion of each of the gate electrodes 10 may protrude toward a source electrode (first electrode) 12 from upper sides (sides facing the later-described source electrode 12) of the trenches 16. Further, preferably, the gate insulating film 9 may be formed on an m plane. For example, preferably, in an instance in which the trench structure is formed, the sidewalls of the trenches 16 may be m planes.

The n-type high-concentration regions 5 (2) have first surfaces (first main side of the silicon carbide semiconductor base) and second surfaces that are opposite to each other, the second surfaces facing the n⁺-type silicon carbide substrate 1, and first p⁺-type base regions 3 are provided in the n-type high-concentration regions 5 (2), at the first surfaces of n-type high-concentration regions 5 (2), between the trenches 16. Further, second p⁺-type base regions 4 that are in contact with the bottoms of the trenches 16 are provided in the n-type high-concentration regions 5 (2). The second p⁺-type base regions 4 are provided at positions facing the bottoms of the trenches 16 in a depth direction (direction from the source electrode 12 to the back electrode 13). A width of each of the second p⁺-type base regions 4 is wider than a width of each of the trenches 16. The bottoms of the trenches 16 may reach the second p⁺-type base regions 4 or may be positioned in the n-type high-concentration regions 5 (2), between the p-type base layer 6 and the second p$^+$-type base regions 4.

Further, in the n$^-$-type silicon carbide epitaxial layer 2, n$^+$-type regions 17 having a peak impurity concentration that is higher than that of the n-type high-concentration regions 5 (2) are provided at positions deeper than are the first p$^+$-type base regions 3 between the trenches 16. A deep position is a position closer to the back electrode 13 than are the first p$^+$-type base regions 3.

In the p-type base layer 6, at the first main side of the silicon carbide semiconductor base 18, n$^+$-type source regions (first semiconductor regions of the first conductivity type) 7 are selectively provided. Further, p$^+$-type contact regions 8 may be selectively provided. Further, the n$^+$-type source regions 7 and the p$^+$-type contact regions 8 are in contact with one another.

An interlayer insulating film 11 is provided on an entire area of the first main side of the silicon carbide semiconductor base 18 so as cover the gate electrodes 10 embedded in the trenches 16. The source electrode 12 is in contact with the n$^+$-type source regions 7 and the p-type base layer 6, via contact holes opened in the interlayer insulating film 11. Further, in an instance in which the p$^+$-type contact regions 8 are provided, the source electrode 12 is in contact with the n$^+$-type source regions 7 and the p$^+$-type contact regions 8. The source electrode 12 is electrically insulated from the gate electrodes 10 by the interlayer insulating film 11. A source pad (not depicted) is provided on the source electrode 12. Between the source electrode 12 and the interlayer insulating film 11, for example, a barrier metal 14 that prevents diffusion of metal atoms from the source electrode 12 to the gate electrodes 10 may be provided.

Next, a method of manufacturing the silicon carbide semiconductor device according to the embodiment is described. First, the n$^+$-type silicon carbide substrate 1 containing an n-type silicon carbide is prepared. Subsequently, on the first main surface of the n$^+$-type silicon carbide substrate 1, a lower n$^-$-type silicon carbide epitaxial layer (not depicted) containing silicon carbide is epitaxially grown to have a thickness of, for example, about 30 μm while an n-type impurity, for example, nitrogen atoms (N), is doped.

Next, on the surface of the lower n$^-$-type silicon carbide epitaxial layer, a non-depicted mask having predetermined openings is formed by a photolithographic technique using, for example, an oxide film. Subsequently, an n-type impurity, for example, nitrogen atoms, may be ion-implanted by an ion implantation method using the oxide film as a mask. As a result, the n$^+$-type regions 17 are formed in the lower n$^-$-type silicon carbide epitaxial layer.

Next, the mask used during the ion implantation for forming the n$^+$-type regions 17 is removed. Next, an ion-implantation mask having predetermined openings is formed by a photolithographic technique using, for example, an oxide film. Subsequently, a p-type impurity such as aluminum is implanted through the openings in the oxide film, thereby forming lower first p$^+$-type base regions (not depicted) and the second p$^+$-type base regions 4 of a depth of about 0.5 μm. In an instance in which the n$^+$-type regions 17 are formed, on first surfaces of the n$^+$-type regions 17 opposite to second surfaces thereof facing the n$^+$-type silicon carbide substrate 1, the lower first p$^+$-type base regions are formed so as to overlap the n$^+$-type regions 17.

Next, the ion implantation mask may be partially removed and an n-type impurity such as nitrogen may be implanted through the openings, whereby lower n-type high-concentration regions (not depicted) having a depth of, for example, about 0.5 μm may be formed in portions of a surface region of the lower n$^-$-type silicon carbide epitaxial layer. An impurity concentration of the lower n-type high-concentration regions is set to, for example, about 1×10$^{17}$/cm$^3$.

Next, on the surface of the lower n$^-$-type silicon carbide epitaxial layer, an upper n$^-$-type silicon carbide epitaxial layer (not depicted) doped with an n-type impurity such as nitrogen is formed having a thickness of about 0.5 μm. An impurity concentration of the upper n$^-$-type silicon carbide epitaxial layer is set to be about 3×10$^{15}$/cm$^3$. Hereinafter, the lower n$^-$-type silicon carbide epitaxial layer and the upper n$^-$-type silicon carbide epitaxial layer combined are assumed as the n$^-$-type silicon carbide epitaxial layer 2.

Next, on the surface of the upper n$^-$-type silicon carbide epitaxial layer, an ion-implantation mask having predetermined openings is formed by photolithography using, for example, an oxide film. Subsequently, a p-type impurity such as aluminum is implanted through openings of the oxide film, whereby upper first p$^+$-type base regions (not depicted) having a depth of about 0.5 μm are formed so as to overlap the lower first p$^+$-type base regions. The upper first p$^+$-type base regions and the lower first p$^+$-type base regions form continuous regions constituting the first p$^+$-type base regions 3. An impurity concentration of the upper first p$^+$-type base regions is set to be, for example, about 5×10$^{18}$/cm$^3$.

Next, the ion implantation mask may be partially removed and an n-type impurity such as nitrogen may be implanted through the openings, whereby upper n-type high-concentration regions (not depicted) having a depth of, for example, about 0.5 μm may be formed in portions of a surface region of the n$^-$-type silicon carbide epitaxial layer 2. An impurity concentration of the upper n-type high-concentration regions is set to, for example, about 1×10$^{17}$/cm$^3$. The upper n-type high-concentration regions and the lower n-type high-concentration regions are formed so as to at least be partially in contact with one another, whereby the n-type high-concentration regions 5 are formed. Nonetheless, the n-type high-concentration regions 5 may be formed in an entire area of the substrate surface or may be omitted.

Next, on the surface of the n$^-$-type silicon carbide epitaxial layer 2, the p-type base layer 6 is formed by epitaxial growth and has a thickness of about 1.1 μm. An impurity concentration of the p-type base layer 6 is set to about 4×10$^{17}$/cm$^3$. After the p-type base layer 6 is formed by epitaxial growth, a p-type impurity such as aluminum may be further ion-implanted in the p-type base layer 6.

Next, in a first main surface layer of the silicon carbide semiconductor base 18 (surface layer of the p-type base layer 6), predetermined regions configuring MOS gates are formed. In particular, on the surface of the p-type base layer 6, an ion-implantation mask having predetermined openings is formed by photolithography using, for example, an oxide film. An n-type impurity such as nitrogen (N) or phosphorus (P) is ion-implanted in the openings, thereby forming the n$^+$-type source regions 7 in portions of the surface of the p-type base layer 6. Next, the ion-implantation mask used in forming the n$^+$-type source regions 7 is removed, and by a similar method, an ion-implantation mask having predetermined openings may be formed, and a p-type impurity such as boron may be ion-implanted in portions of the p-type base layer 6, whereby the p$^+$-type contact regions 8 may be formed in the surface regions of the p-type base layer 6. An impurity concentration of the p$^+$-type contact regions 8 is set to be higher than the impurity concentration of the p-type base layer 6.

Next, a heat treatment (activation annealing) for activating all regions formed by ion implantation is performed. For example, a heat treatment (annealing) under an inert gas atmosphere at a temperature of about 1700 degrees C. is performed, thereby implementing an activation treatment for the first p$^+$-type base regions 3, the second p$^+$-type base regions 4, the n$^+$-type source regions 7, the p$^+$-type contact regions 8, and the n$^+$-type regions 17. The ion-implanted regions may be collectively activated by a single session of the heat treatment as described above or the heat treatment may be performed each time ion implantation is performed.

Next, on the surface of the p-type base layer 6, a trench formation mask having predetermined openings is formed by photolithography using, for example, an oxide film. Next, by dry etching, the trenches 16 that penetrate through the p-type base layer 6 and reach the n-type high-concentration regions 5 (2) are formed. The bottoms of the trenches 16 may reach the second p$^+$-type base regions 4 formed in the n-type high-concentration regions 5 (2). Next, the trench formation mask is removed. Next, the front surface of the silicon carbide semiconductor base 18 is subjected to, for example, RCA cleaning (wet cleaning using a strong acid and high base solution).

Figure 2:
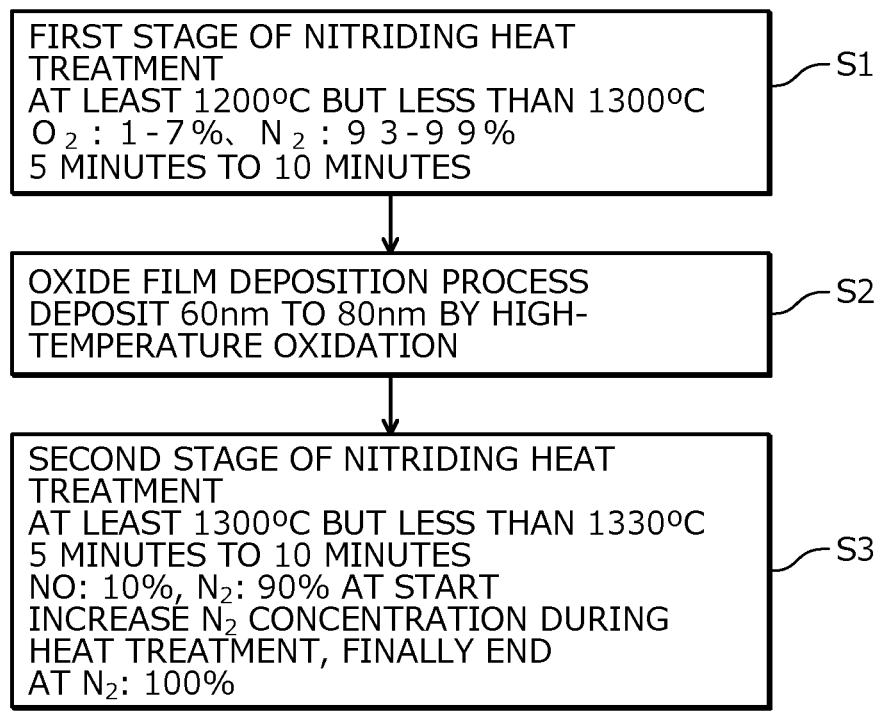
FIG. 2 is a flowchart of a method of manufacturing a gate insulating film of the silicon carbide semiconductor device according to the embodiment.

Next, the gate insulating film 9 is formed along the surfaces of the n$^-$-type source regions 7 as well as along the bottoms and the sidewalls of the trenches 16. Hereinafter, a method of manufacturing the gate insulating film 9 of the embodiment is described in detail. FIG. 2 is a flowchart of the method of manufacturing the gate insulating film of the silicon carbide semiconductor device according to the embodiment. In the embodiment, front surfaces of semiconductor layers (the first p$^+$-type base regions 3, the n-type high-concentration regions 5, the p-type base layer 6, and the n$^+$-type source regions 7) of the sidewalls of the trenches 16 are assumed to be m planes.

First, on the front surfaces of the silicon carbide layers, a first stage of a nitriding heat treatment by a gas containing 02 (oxygen) and N$_2$ (nitrogen) is performed (step S1: ninth process). The first stage of the nitriding heat treatment is performed for at least 5 minutes but not more than 10 minutes at a temperature that is at least about 1200 degrees C. but less than about 1300 degrees C. by a O$_2$1-7%/ remaining N$_2$ gas (a gas containing 1 to 7% O$_2$ and the remaining 93 to 99% being N$_2$, similar notation hereinafter). As a result, the front surfaces of the silicon carbide layers are nitrided and subjected to thermal oxidation, whereby a nitride film and an oxide film are formed. The first stage of the nitriding heat treatment has a lower ratio of oxygen than conventionally, whereby the amount of oxidation (film thickness) when the SiC trench sidewalls are nitrided and oxidized is minimized as much as possible and damage (excess C, disturbance of crystal at the interface, etc.) of the SiC surface due to oxidation is reduced as much as possible. The oxide film formed by this thermal oxidation is a SiO$_2$ film having favorable quality and high density.

Next, an oxide film is deposited by high-temperature oxidation (step S2: tenth process). The high-temperature oxidation is performed at a temperature of 800 degrees C. by introducing dichlorosilane (DCS) and N$_2$O. Instead of the DCS, monosilane (SiH$_4$) may be used. In this case, a furnace input temperature is 600 degrees C. and is obtained by raising the temperature and vacuum-exhausting for about 1 hour. As a result, an oxide film having a thickness in a range of 60 nm to 80 nm is formed.

Next, a second stage of the nitriding heat treatment is performed by a gas containing NO (nitric oxide) and N$_2$ (step S3: eleventh process). The second stage of the nitriding heat treatment begins treatment at a temperature that is at least 1300 degrees C. but less than 1330 degrees C. by a NO10%/N$_2$90% gas; during the annealing, the N$_2$ concentration is gradually increased and the treatment is finally finished with a N$_2$100% gas. This treatment is performed for 5 minutes to 10 minutes. Here, N$_2$100% needs not be exactly 100% and a trace amount NO may be contained. In this manner, in the embodiment, at a treatment starting point, the first stage of the nitriding heat treatment has a greater nitrogen amount while at a treatment ending point, the second stage of the nitriding heat treatment has a greater nitrogen amount.

By the high-temperature oxidation at step S2, N escapes from the surface of the SiC/SiO$_2$ nitrided by the first stage of the nitriding heat treatment and thus, to again accumulate N at the interface, the second stage of the nitriding heat treatment is performed. The second stage of the nitriding heat treatment is performed at a higher temperature than that of the first stage of the nitriding heat treatment, whereby the interface may be sufficiently nitrided and the interface between the gate insulating film 9 and the SiC may be nitrided a suitable amount. To minimize post-oxidation of the SiC interface, preferably, a total heat treatment time of the first stage of the nitriding heat treatment and the second stage of the nitriding heat treatment may be shorter than the time that a nitriding heat treatment is performed after the deposition of the conventional oxide film. Thus, the gate insulating film 9 is formed.

Next, on the gate insulating film 9, a polycrystal silicon layer doped with, for example, phosphorus atoms is provided. The polycrystal silicon layer may be formed so as to be embedded in the trenches 16. The polycrystal silicon layer is patterned by photolithography and is left in the trenches 16, whereby the gate electrodes 10 are formed.

Next, for example, a phosphate glass is deposited so as to cover the gate insulating film 9 and the gate electrodes 10, the deposited phosphate glass having a thickness of about 1 μm, whereby the interlayer insulating film 11 is formed. Next, the barrier metal 14 containing titanium (Ti) or titanium nitride (TiN) may be formed so as to cover the interlayer insulating film 11. The interlayer insulating film 11 and the gate insulating film 9 are patterned by photolithography, whereby contact holes that expose the n$^+$-type source regions 7 and the p$^+$-type contact regions 8 are formed. Thereafter, a heat treatment (reflow) is performed and the interlayer insulating film 11 is planarized.

Next, the interlayer insulating film 11 is selectively removed and a nickel (Ni) or Ti film is deposited on the surface of the silicon carbide semiconductor base 18. Next, the surface is protected, and a Ni or Ti film is deposited on the back surface of the n$^+$-type silicon carbide substrate 1. Next, a heat treatment of about 1000 degrees C. is performed, thereby forming ohmic electrodes at the surface of the silicon carbide semiconductor base 18 and the back surface of the n$^+$-type silicon carbide substrate 1.

Next, a conductive film constituting the source electrode 12 is provided on the interlayer insulating film 11 and is in contact with ohmic electrode portions formed in the contact holes, whereby the n$^+$-type source regions 7 and the p$^+$-type contact regions 8 are in contact with the source electrode 12.

Subsequently, on the second main surface of the n$^+$-type silicon carbide substrate 1, for example, the back electrode 13 constituted by a nickel (Ni) film is formed. Thereafter, a heat treatment is performed at a temperature of, for example, about 970 degrees C., whereby an ohmic junction is formed between the n$^+$-type silicon carbide substrate 1 and the back electrode 13.

Next, for example, in the openings of the interlayer insulating film 11 and on the source electrode 12 at the front surface of the silicon carbide semiconductor base 18, an electrode pad constituting the source pad (not depicted) is deposited by a sputtering method. A portion of the electrode pad on the interlayer insulating film 11 has a thickness that may be, for example, 5 μm. The electrode pad, for example, may be formed by aluminum (Al—Si) containing silicon at a rate of 1%. Next, the source pad is selectively removed.

Next, on the surface of the back electrode 13, for example, titanium (Ti), nickel (Ni), and gold (Au) are sequentially deposited as the drain electrode pad (not depicted). Thus, as described above, the silicon carbide semiconductor device depicted in FIG. 1 is completed.

In this manner, in the embodiment, the gate insulating film 9 is formed by 3 processes including the first stage of the nitriding heat treatment using the mixed gas containing $N_2$ and $O_2$, oxide film deposition, and the second stage of the nitriding heat treatment in which the mixing ratio of NO and $N_2$ is varied according to time. In the first stage of the nitriding heat treatment, the mixed gas containing nitrogen and oxygen is used, whereby oxidation fractional pressure may be reduced as much as possible. By the second stage of the nitriding heat treatment, the treatment is performed gradually decreasing the concentration of nitric oxide from the start to the end, whereby nitrogen is diffused into the HTO by the initial NO, thereby uniformly nitriding the HTO film, including the interface while suppressing oxidation of the interface as much as possible.

Figure 3:
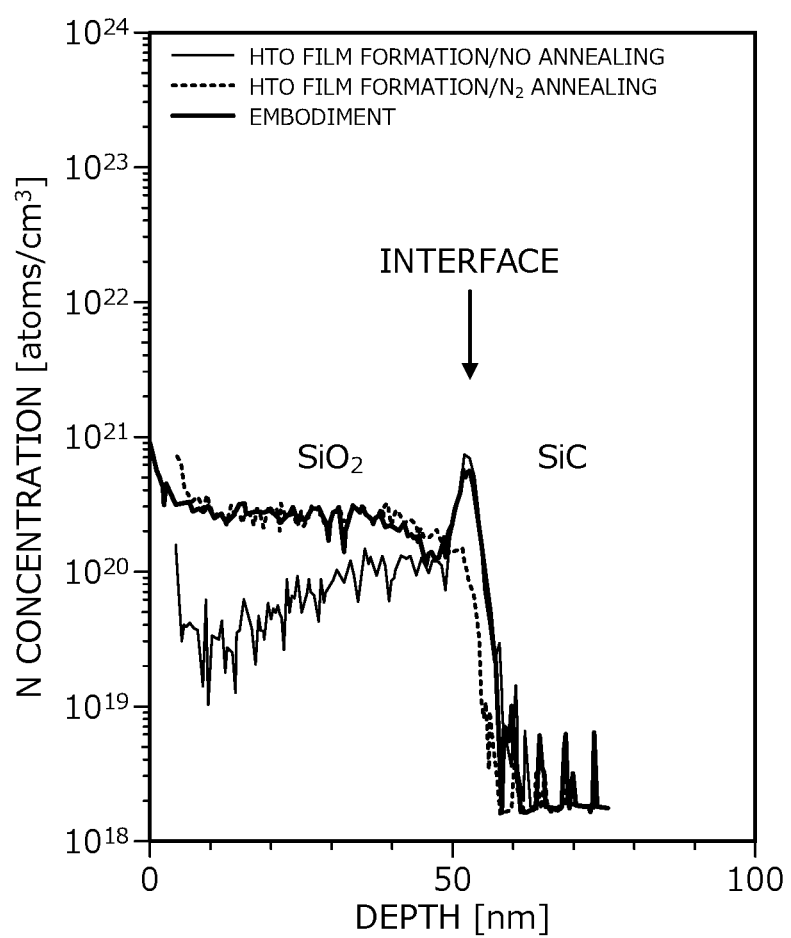
FIG. 3 shows SIMS data for a vicinity of gate insulating films respectively formed by a conventional method of film formation, and by a method of film formation in the present embodiment.

FIG. 3 shows SIMS data for a vicinity of gate insulating films respectively formed by annealing at 1250 degrees C. in 100% nitrogen after HTO deposition, by the conventional method of film formation, and by the method of film formation in the present embodiment. In FIG. 3, a vertical axis represents nitrogen concentration in units of atoms/$cm^3$. A horizontal axis represents depth from the surface of the gate insulating film 9 in units of nm. Here, near a depth of 50 nm is where the gate insulating film 9 interfaces with the silicon carbide layers (the n-type high-concentration regions 5 (2), the p-type base layer 6, the $n^+$-type source regions 7, etc.).

As depicted in FIG. 3, the results of the SIMS analysis reveal that for the gate insulating film (thin line in FIG. 3) formed in the sequence of the conventional HTO film deposition/NO annealing, the nitrogen concentration of the interface was $7 \times 10^{20}$ atoms/$cm^3$ and thus, high at the interface while at a surface side of the HTO (side opposite to that facing SiC), the N concentration was low. Further, for the gate insulating film (dotted line in FIG. 3) formed in the sequence of HTO/$N_2$ treatment, N is present uniformly in the $SiO_2$. On the other hand, the nitrogen concentration of the interface is lower than the concentration in the $SiO_2$.

Thus, in the embodiment, the second stage of the NO annealing is performed, whereby the N concentration of the interface is increased. Further, from the results of the HTO/$N_2$, the $N_2$ annealing is performed increasing the concentration of $N_2$ over time, whereby the N concentration near the surface of the HTO is increased. As a result, in the embodiment (thick line in FIG. 3), the escape of N is inhibited and the N concentration in the HTO film is substantially uniform in the depth direction and gradually increases near the surface, the N concentration being at least $5 \times 10^{19}$ atoms/$cm^3$. Further, a peak of the N concentration is in a range of $1 \times 10^{20}$ atoms/$cm^3$ to $1 \times 10^{21}$ atoms/$cm^3$ at the interface. Further, in the process of the second stage of the nitriding heat treatment, while the initial ratio is NO:10%, $N_2$:90%, the $N_2$ concentration is increased over time, and finally is $N_2$:100%. From the results of the HTO/$N_2$ (dotted line FIG. 3) in FIG. 3, in the $N_2$ annealing, nitriding does not occur at the interface and therefore, $N_2$ does not reach the interface. Thus, in the embodiment, oxidation due to NO is suppressed.

FIG. 4 is a table showing mobility and threshold voltage of silicon carbide semiconductor devices manufactured by the conventional method and the method of the embodiment. As depicted in FIG. 4, in the silicon carbide semiconductor device of the embodiment, compared to the conventional silicon carbide semiconductor device formed in the sequence of 10% NO annealing/HTO film deposition/10% NO annealing, mobility increased about 25% and the threshold voltage was enhanced 44%. In this manner, the embodiment improves the tradeoff relationship between mobility and threshold voltage.

Figure 5:
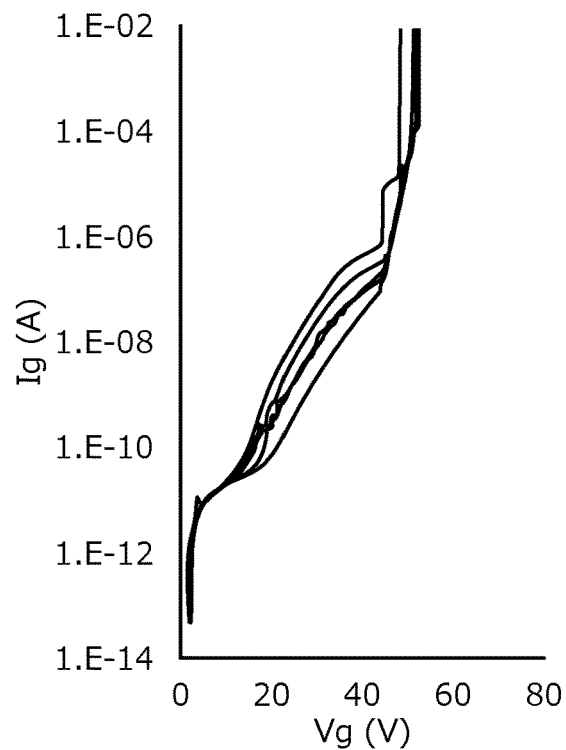
FIG. 5 is a graph of TZDB waveforms for a silicon carbide semiconductor device manufactured by the convention method.
Figure 6:
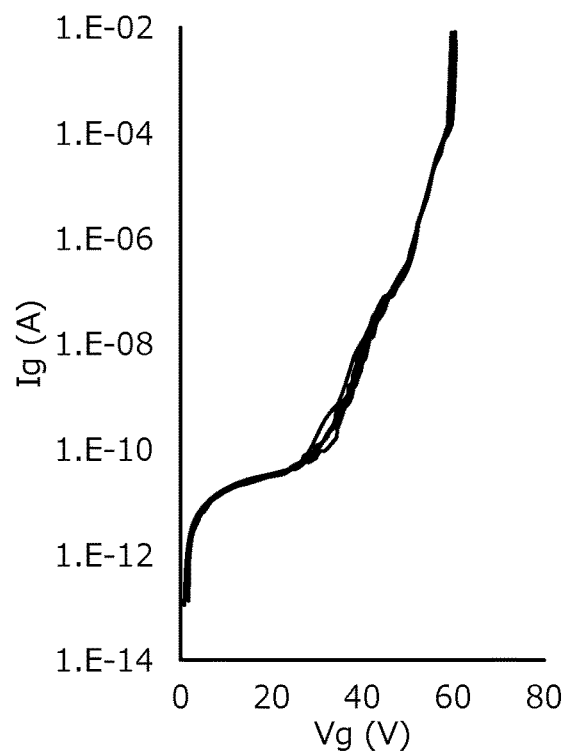
FIG. 6 is a graph showing TZDB waveforms of the silicon carbide semiconductor device manufactured by the method of the embodiment.

Further, FIG. 5 is a graph of TZDB waveforms for the silicon carbide semiconductor device manufactured by the convention method. FIG. 5 shows TZDB waveforms of the silicon carbide semiconductor device in which the gate insulating film is formed in the sequence of the conventional HTO film deposition/NO annealing. FIG. 6 is a graph showing TZDB waveforms of the silicon carbide semiconductor device manufactured by the method of the embodiment. In FIGS. 5 and 6, vertical axes represent gate current Ig in units of A. Horizontal axes represent gate voltage Vg in units of V. As depicted in FIGS. 5 and 6, in the conventional TZDB waveforms, a phenomenon in which from 20V to around 40V, the leak current is large, however, in the embodiment, from 20V to 40V, the leak current is small. Further, in the embodiment, variation of the TZDB waveforms is small.

As described above, according to the embodiment, in the first stage of the nitriding heat treatment, oxidation fractional pressure is reduced and by the second stage of the nitriding heat treatment, nitriding is performed while postoxidation of the interface is suppressed, whereby oxidation of the SiC interface is minimized, damage (excess C, disturbance of crystal at the interface, etc.) caused by oxidation of the SiC of the trench sidewalls where the channels are formed may be reduced, and the interface between the gate insulating film and the SiC is nitrified a suitable amount, enabling uniform distribution of N in the gate insulating film. Thus, device element characteristics that degrade due to damage, disturbance of the $SiO_2$/SiC interface, etc. may be improved. For example, the threshold voltage may be enhanced with minimal drops in mobility. Further, the leak current of low electric field regions during TZDB measurement may be reduced.

In the foregoing, the present invention may be variously modified within a range not departing from the spirit of the invention and in the embodiments described above, for example, dimensions, impurity concentrations, etc. of parts may be variously set according to necessary specifications. Further, in the embodiment described above, while an instance in which silicon carbide is used as a wide band gap semiconductor, a wide band gap semiconductor other than silicon carbide, for example, gallium nitride (GaN) is applicable. Further, a semiconductor other than a wide band gap semiconductor such as silicon (Si), germanium (Ge), etc. is applicable. Further, in the embodiments, while the first conductivity type is assumed to be an n-type and the second conductivity type is assumed to be a p-type, the present invention is similarly implemented when the first conductivity type is a p-type and the second conductivity type is an n-type.

According to the invention described above, in the first stage of the nitriding heat treatment, oxidation fractional pressure is reduced and by the second stage of the nitriding heat treatment, nitriding is performed while post-oxidation of the interface is suppressed, whereby oxidation of the SiC interface is minimized, damage (excess C, disturbance of crystal at the interface, etc.) caused by oxidation of the SiC of the trench sidewalls where the channels are formed may be reduced, and the interface between the gate insulating film and the SiC is nitrified a suitable amount, enabling uniform distribution of N in the gate insulating film. Thus, device element characteristics that degrade due to damage, disturbance of the $SiO_2$/SiC interface, etc. may be improved. For example, the threshold voltage may be enhanced with minimal drops in mobility. Further, leak current of low electric field regions during TZDB measurement may be reduced.

The method of manufacturing a silicon carbide semiconductor device and a silicon carbide semiconductor device achieve an effect in that the ratio of nitrogen gas and oxygen gas during annealing is varied, reducing oxidation in the nitriding process, whereby damage and disturbance of the $SiO_2$/SiC interface are reduced, nitriding in the $SiO_2$ film is uniform, and device element characteristics may be improved.

As described above, the method of manufacturing a silicon carbide semiconductor device and a silicon carbide semiconductor device according to the present invention are useful for power semiconductor devices used in power converting equipment such as inverters, power source devices such those in various types of industrial machines, igniters of automobiles, etc.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A method of manufacturing a silicon carbide semiconductor device, the method comprising:
    preparing a silicon carbide semiconductor substrate of a first conductivity type, the silicon carbide semiconductor substrate having a first surface and a second surface that are opposite to each other;
    forming a first semiconductor layer of the first conductivity type on the first surface of the silicon carbide semiconductor substrate, the first semiconductor layer having an impurity concentration that is lower than an impurity concentration of the silicon carbide semiconductor substrate, the first semiconductor layer having a first surface and a second surface that are opposite to each other, the second surface of the first semiconductor layer facing the silicon carbide semiconductor substrate;
    forming a second semiconductor layer of a second conductivity type on the first surface of the first semiconductor layer, the second semiconductor layer having a first surface and a second surface that are opposite to each other, the second surface of the second semiconductor layer facing the silicon carbide semiconductor substrate;
    selectively forming a plurality of first semiconductor regions of the first conductivity type in the second semiconductor layer, at the first surface of the second semiconductor layer;
    forming a plurality of trenches that penetrate through the first semiconductor regions and the second semiconductor layer, and reach the first semiconductor layer;
    forming a gate insulating film in the trenches, along sidewalls and bottoms of the trenches;
    forming a plurality of gate electrodes on the gate insulating film in the trenches;
    forming a first electrode on surfaces of the first semiconductor regions and the first surface of the second semiconductor layer; and
    forming a second electrode on the second surface of the silicon carbide semiconductor substrate, wherein
    forming the gate insulating film includes forming the gate insulating film using a nitriding heat treatment that has a first stage and a second stage, by
        performing the first stage of the nitriding heat treatment by a first gas containing oxygen and nitrogen,
        depositing an oxide film after performing the first stage of the nitriding heat treatment, and
        performing the second stage of the nitriding heat treatment by a second gas containing nitric oxide and nitrogen, after depositing the oxide film;
    an amount of the nitrogen at a treatment starting point of the first stage of the nitriding heat treatment is greater than an amount of the nitrogen at a treatment starting point of the second stage of the nitriding heat treatment; and
    an amount of the nitrogen at a treatment ending point of the second stage of the nitriding heat treatment is greater than an amount of the nitrogen at a treatment ending point of the first stage of the nitriding heat treatment.

2. The method according to claim 1, wherein
the first gas contains 1% to 7% oxygen and 93% to 99% nitrogen.

3. The method according to claim 1, wherein
the second gas contains 10% nitric oxide and 90% nitrogen at the treatment starting point of the second stage of the nitriding heat treatment, and
a concentration of the nitric oxide gradually decreases until the second gas is 100% nitrogen at the treatment ending point of the second stage of the nitriding heat treatment.

4. A silicon carbide semiconductor device, comprising:
    a silicon carbide semiconductor substrate of a first conductivity type, the silicon carbide semiconductor substrate having a first surface and a second surface that are opposite to each other;
    a first semiconductor layer of the first conductivity type, provided on the first surface of the silicon carbide semiconductor substrate, the first semiconductor layer having an impurity concentration that is lower than an impurity concentration of the silicon carbide semiconductor substrate, the first semiconductor layer having a first surface and a second surface that are opposite to each other, the second surface of the first semiconductor layer facing the silicon carbide semiconductor substrate;
    a second semiconductor layer of a second conductivity type, provided on the first surface of the first semiconductor layer, the second semiconductor layer having a first surface and a second surface that are opposite to each other, the second surface of the second semiconductor layer facing the silicon carbide semiconductor substrate;

a plurality of first semiconductor regions of the first conductivity type, selectively provided in the second semiconductor layer, at the first surface of the second semiconductor layer;

a plurality of trenches that penetrate through the first semiconductor regions and the second semiconductor layer, and reach the first semiconductor layer;

a gate insulating film provided in the trenches, along bottoms and sidewalls of the trenches;

a plurality of gate electrodes provided on the gate insulating film in the trenches;

a first electrode provided on surfaces of the first semiconductor regions and the first surface of the second semiconductor layer; and a second electrode provided on the second surface of silicon carbide semiconductor substrate, wherein the silicon carbide semiconductor device has a peak nitrogen concentration at interfaces between the gate insulating film and the first semiconductor regions and between the gate insulating film and the second semiconductor layer, in a range of $1 \times 10^{20}$ atoms/cm$^3$ to $1 \times 10^{21}$ atoms/cm$^3$.

5. The silicon carbide semiconductor device according to claim 4, wherein the gate insulating film contains nitrogen at a concentration of at least $5 \times 10^{19}$ atoms/cm$^3$.

* * * * *